(12) United States Patent
Fastow et al.

(10) Patent No.: US 6,773,990 B1
(45) Date of Patent: Aug. 10, 2004

(54) METHOD FOR REDUCING SHORT CHANNEL EFFECTS IN MEMORY CELLS AND RELATED STRUCTURE

(75) Inventors: Richard Fastow, Cupertino, CA (US); Yue-Song He, San Jose, CA (US); Kazuhiro Mizutani, Sunnyvale, CA (US); Timothy Thurgate, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/429,150

(22) Filed: May 3, 2003

(51) Int. Cl.[7] .................................. H10L 21/336
(52) U.S. Cl. ........................ 438/257; 438/593
(58) Field of Search ...................... 438/257–259, 438/369–370, 525–527

(56) References Cited

U.S. PATENT DOCUMENTS 6,410,389 B1 * 6/2002 Cappelletti et al. ......... 438/257

* cited by examiner

*Primary Examiner*—Dung A. Le
(74) *Attorney, Agent, or Firm*—Farjami & Farjami LLP

(57) ABSTRACT

According to one exemplary embodiment, a method for fabricating a floating gate memory array comprises a step of removing a dielectric material from an isolation region situated in a substrate to expose a trench, where the trench is situated between a first source region and a second source region, where the trench defines sidewalls in the substrate. The method further comprises implanting an N type dopant in the first source region, the second source region, and the sidewalls of the trench, where the N type dopant forms an N+ type region. The method further comprises implanting a P type dopant in the first source region, the second source region, and the sidewalls of the trench, where the P type dopant forms a P type region, and where the P type region is situated underneath the N+ type region.

15 Claims, 4 Drawing Sheets

METHOD FOR REDUCING SHORT CHANNEL EFFECTS IN MEMORY CELLS AND RELATED STRUCTURE

1. TECHNICAL FIELD

The present invention is generally in the field of semiconductor fabrication. More specifically, the present invention is in the field of fabrication of semiconductor memory cells.

2. BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only-memory (EPROM), and electrically-erasable-programmable-read-only-memory (EEPROM) devices. EEPROM devices differ from other non-volatile memory devices in that they can be electrically programmed and erased. Flash memory devices are similar to EEPROM devices in that memory cells can be programmed and erased electrically. However, flash memory devices enable the simultaneous erasing of all memory cells.

Product development efforts in flash memory devices have focused on increasing the programming speed, lowering programming and reading voltages, increasing data retention time, reducing cell erasure times, and reducing cell dimensions. By reducing cell dimensions, flash memory devices can achieve increased speed and reduced power consumption. As the flash memory cell is reduced in size, the flash memory cell's channel length is also reduced in size. By way of background, in a floating gate flash memory cell, the channel length refers to the length of the region situated between source and drain junctions of the flash memory cell that is controlled by the flash memory cell's floating gate. As the channel length of the memory cell decreases, the source and drain regions of the memory cell become effectively closer to each other, which can cause undesirable short channel effects. For example, the short channel effect known as "punch through" occurs when a high drain voltage causes uncontrolled current, i.e. current that is not controlled by the memory cell's floating gate, to flow. Punch through can start to occur at channel lengths less than 0.5 micron, for example. Drain induced barrier lowering ("DIBL") is another undesirable short channel effect that starts to occur as channel length decreases. As a result of DIBL, the memory cell's effective threshold voltage decreases, which undesirably affects the performance of the memory cell.

In CMOS devices, two conventional techniques utilized to reduce short channel affects, such as punch through and DIBL, are halo doping and retrograde well doping. In halo doping, a high concentration of P type dopant is implanted, for example, close to source and drain junctions of an N-channel device, such as an NFET. The high concentration of P type dopant implanted around the source and drain junctions reduces short channel effects, such as punch through and DIBL, by making the depletion region between source and drain junctions much smaller. In retrograde well doping, a high concentration of P type dopant is formed below the substrate surface at a depth in a P well where punch through can occur in an N-channel device, such as an NFET. As a result, the high concentration of P type dopant in the P well reduces the effective width of the depiction region between source and drain junctions, which reduces punch through in the N-channel device. However, the high concentration of P type dopant situated close of the drain junction in the conventional halo doping and retrograde well doping techniques can cause undesirable drain junction breakdown.

Also, the conventional halo and retrograde well doping techniques discussed above are difficult to apply to floating gate flash memory cells having small dimensions, since the implanted P type dopant diffuses quickly.

Thus, there is a need in the art for an effective method for reducing short channel effects in memory cells, such as floating gate flash memory cells.

SUMMARY

The present invention is directed to method for reducing short channel effects in memory cells and related structure. The present invention addresses and resolves the need in the art for an effective method for reducing short channel effects in memory cells, such as floating gate flash memory cells.

According to one exemplary embodiment, a method for fabricating a floating gate memory array comprises a step of removing a dielectric material from an isolation region situated in a substrate to expose a trench, where the trench is situated between a first source region and a second source region, where the trench defines sidewalls in the substrate. The floating gate memory array may be a floating gate flash memory array, for example. The dielectric material may be removed, for example, in a self-aligned source etch. The method further comprises implanting an N type dopant in the first source region, the second source region, and the sidewalls of the trench, where the N type dopant forms an N+ type region.

The method further comprises implanting a P type dopant in the first source region, the second source region, and the sidewalls of the trench, where the P type dopant forms a P type region, and where the P type region is situated underneath the N+ type region. The P type dopant can be boron, for example. The P type dopant can be implanted at an angle of between approximately 45.0 degrees and approximately 90.0 degrees with respect to a top surface of the first source region, for example. The P type dopant is not implanted in a drain region, where the drain region is separated from the first source region by a word line. The method further comprises performing a thermal cycle, where the thermal cycle causes the P type dopant to form a retrograde profile underneath the N+ type region and a graded concentration profile adjacent to the N+ type region.

In one embodiment, the invention is a floating gate memory array fabricated by utilizing the above discussed method. Other features and advantages of the present invention will become more readily apparent to those of ordinary skill in the art after reviewing the following detailed description and accompanying drawings.

DETAILED DESCRIPTION OF THE INVENTION

The present invention is directed to method for reducing short channel effects in memory cells and related structure.

The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention involves an innovative channel doping process for reducing short channel effects in memory cells, such as floating gate flash memory cells. As will be discussed below, by reducing short channel effects in a floating gate memory cell, the present invention's innovative channel doping process advantageously achieves a floating gate memory cell having increased performance. The present invention can be applied to any non-volatile floating gate memory, including flash floating gate memory.

Figure 1:
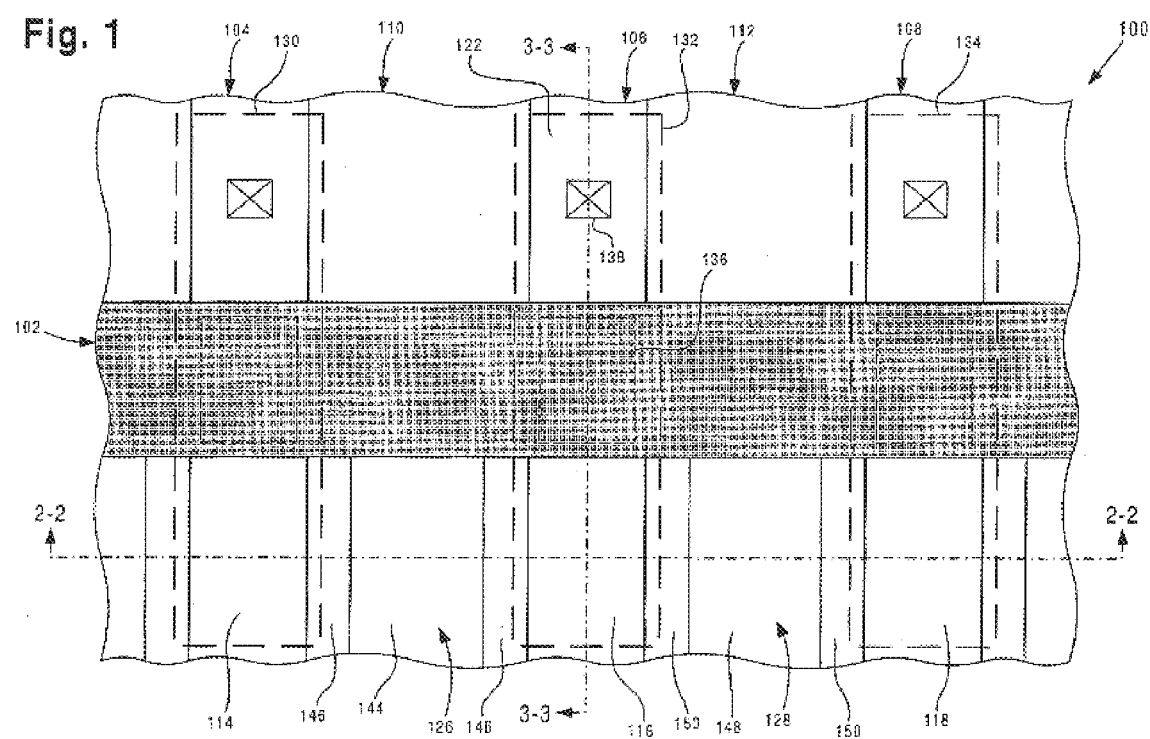
FIG. 1 illustrates a top view of a structure including exemplary memory cells, in accordance with one embodiment of the present invention.

FIG. 1 shows a top view of an exemplary structure including exemplary memory cells in accordance with one embodiment of the present invention. Structure 100 includes word line 102, bit lines 104, 106, and 108, oxide isolation regions 110, and 112, source regions 114, 116, and 118, drain region 122, trenches 126 and 128, and memory cells 130, 132, and 134. Structure 100 can be, for example, a floating gate memory array, such as a floating gate flash memory array.

As shown in FIG. 1, memory cell 132 includes floating gate 136, which is situated underneath word line 102. In the present embodiment memory cell 132 is a floating gate memory cell. In one embodiment, memory cell 132 is a floating gate flash memory cell. Memory cell 132 further includes drain contact 138, which connects drain region 122 of memory cell 132 to bit line 106. Memory cell 132 also includes source region 116, which is situated adjacent to word line 102 in a substrate (not shown in FIG. 1). It is noted that although only memory cell 132 is described in detail herein to preserve brevity, memory cells 130 and 134 are similar to memory cell 132 in composition and manner of fabrication.

Also shown in FIG. 1, word line 102 is situated over and aligned perpendicular to bit lines 104, 106, and 108, which are situated in a substrate (not shown in FIG. 1). Word line 102 and bit lines 104, 106, and 108 can be fabricated in a manner known in the art. Further shown in FIG. 1, oxide isolation region 110 is situated between bit lines 104 and 106 and can be, for example, a shallow trench isolation ("STI") region. Oxide isolation region 110 can comprise silicon oxide or other appropriate dielectric material and can be fabricated in a substrate (not shown in FIG. 1) in a manner known in the art. Also shown in FIG. 1, oxide isolation region 112 is situated between bit lines 106 and 108 and comprises similar material and is fabricated in a similar manner as oxide isolation region 110.

Further shown in FIG. 1, trench 126 is situated between source regions 114 and 116. Trench 126 is formed by removing dielectric material, e.g. silicon oxide, in a portion of oxide isolation region 110 situated between source regions 114 and 116, which are adjacent to word line 102. The dielectric material can be removed by etching the portion of oxide isolation region 110 situated between source regions 114 and 116 using a self-aligned source etch process, for example. Trench 126 includes sidewalls 146 and bottom surface 126. Also shown in FIG. 1, trench 128 is situated between source regions 116 and 118 and is formed in a similar manner as trench 126. Trench 128 includes sidewalls 150 and bottom surface 148. An N+ source implant is performed in trenches 126 and 128 and in source regions 114, 116, and 118 to electrically interconnect source regions 114, 116, and 118. The N+ source implant can comprise an N type dopant such as arsenic or other appropriate N type dopant and forms an N+ type region (not shown in FIG. 1) in source regions 114, 116, and 118. Also shown in FIG. 1, drain region 122 is situated adjacent to floating gate 136 and comprises an N type dopant. It is noted that only drain region 122 is specifically discussed herein to preserve brevity.

In the present embodiment, a P type dopant is implanted in source regions 114, 116, and 118 and in trenches 126 and 128 to form a P type region (not shown in FIG. 1). The P type dopant can comprise boron and can be implanted at an angle with respect to respective top surfaces of source regions 114, 116, and 118. In one embodiment, the P type dopant is implanted before the N+ source implant. The P type dopant is not implanted in drain regions, such as drain region 122. After the P type dopant is implanted, a thermal cycle is performed to cause the P type dopant to diffuse underneath source regions 114, 116, and 118. As a result of the present invention's P type doping process discussed above, a retrograde profile and a graded concentration profile are formed underneath an N+ type region (not shown in FIG. 1) formed in each source region, which advantageous reduce short channel effects, such as punch through and DIBL discussed above. The present invention's innovative P type doping process will be discussed below in relation to FIGS. 2 and 3.

Figure 2:
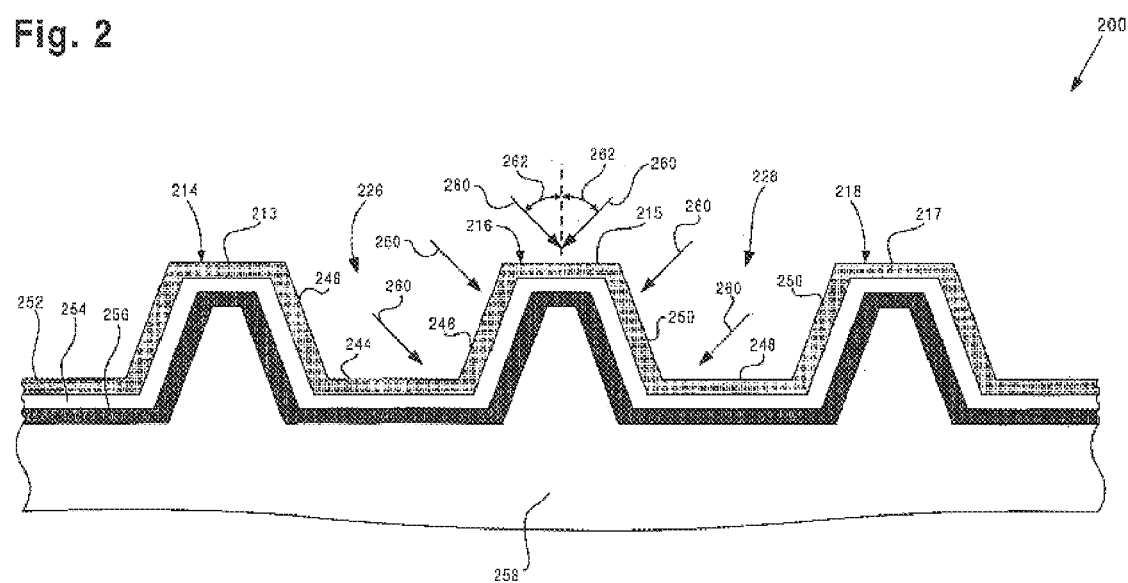
FIG. 2 illustrates a cross-sectional view along the line 2—2 in FIG. 1 of the structure of FIG. 1.

Structure 200 in FIG. 2 corresponds to a cross-sectional view of structure 100 along line 2—2 in FIG. 1. In particular, source regions 214, 216, and 218, trenches 226 and 228, sidewalls 246 and 250, and bottom surfaces 244 and 248, in structure 200, respectively, correspond to source regions 114, 116, and 118, trenches 126 and 128, sidewalls 146 and 150, and bottom surfaces 144 and 148, in structure 100. It is noted that word line 102 and floating gate 136 are not shown in FIG. 2 to preserve clarity of illustration.

As shown in FIG. 2, N+ type region 252 is situated below respective top surfaces 213, 215, and 217 of source regions 214, 216, and 218, sidewalls 246 and bottom surface 244 of trench 226, and sidewalls 250 and bottom surface 248 of trench 228 in substrate 258. N+ type region 252 electrically interconnects source regions 214, 216, and 218, and is formed by implanting an N type dopant, such as arsenic, in source regions 214, 216, and 218 and in trenches 226 and 228.

Also shown in FIG. 2, P well 254 is situated underneath N+ region 252 in substrate 258 and can be formed by appropriately doping substrate 258 in a manner known in the art. Further shown in FIG. 2, P type region 256 is situated underneath P well 254 in substrate 258 and can comprise a P type dopant such as boron. P type region 256 can be formed by utilizing P type implant 260 to implant a P type dopant, e.g. boron, at implant angle 262 with respect to top surfaces 213, 215, and 217 of source regions 214, 216, and 218, respectively. Implant angel 262 is situated in a plane that is perpendicular to top surfaces 213, 215, and 217 of source regions 214, 216, and 218, respectively and parallel to word line 102 in FIG. 1. By way of example, implant angle 262 can be between approximately 45.0 degrees and approximately 90.0 degrees. P type implant 260 can implant a P type dopant, e.g. boron, at an implant dosage of between approximately $1\times10^{14}$ atoms per $cm^2$ and approximately $1\times10^{15}$ atoms per $cm^2$, for example. By way of example, P type implant 260 can implant a P type dopant at a power of approximately 30.0 keV.

By implanting a P type dopant at implant angle 262, the present invention can effectively implant P type dopant into respective sidewalls 246 and 250 of trenches 226 and 228, respective top surfaces 213, 215, and 217 of source regions 214, 216, and 218, and respective bottom surfaces 244 and 248 of trenches 226 and 228. As a result, P type region 256 can be formed underneath N+ type region 252 at a desired depth in substrate 258. Thus, as will be discussed in detail below in relation to FIG. 3, the present invention's P type doping process advantageously achieves effective retrograde and graded concentration profiles underneath source regions 114, 116, and 118.

Figure 3:
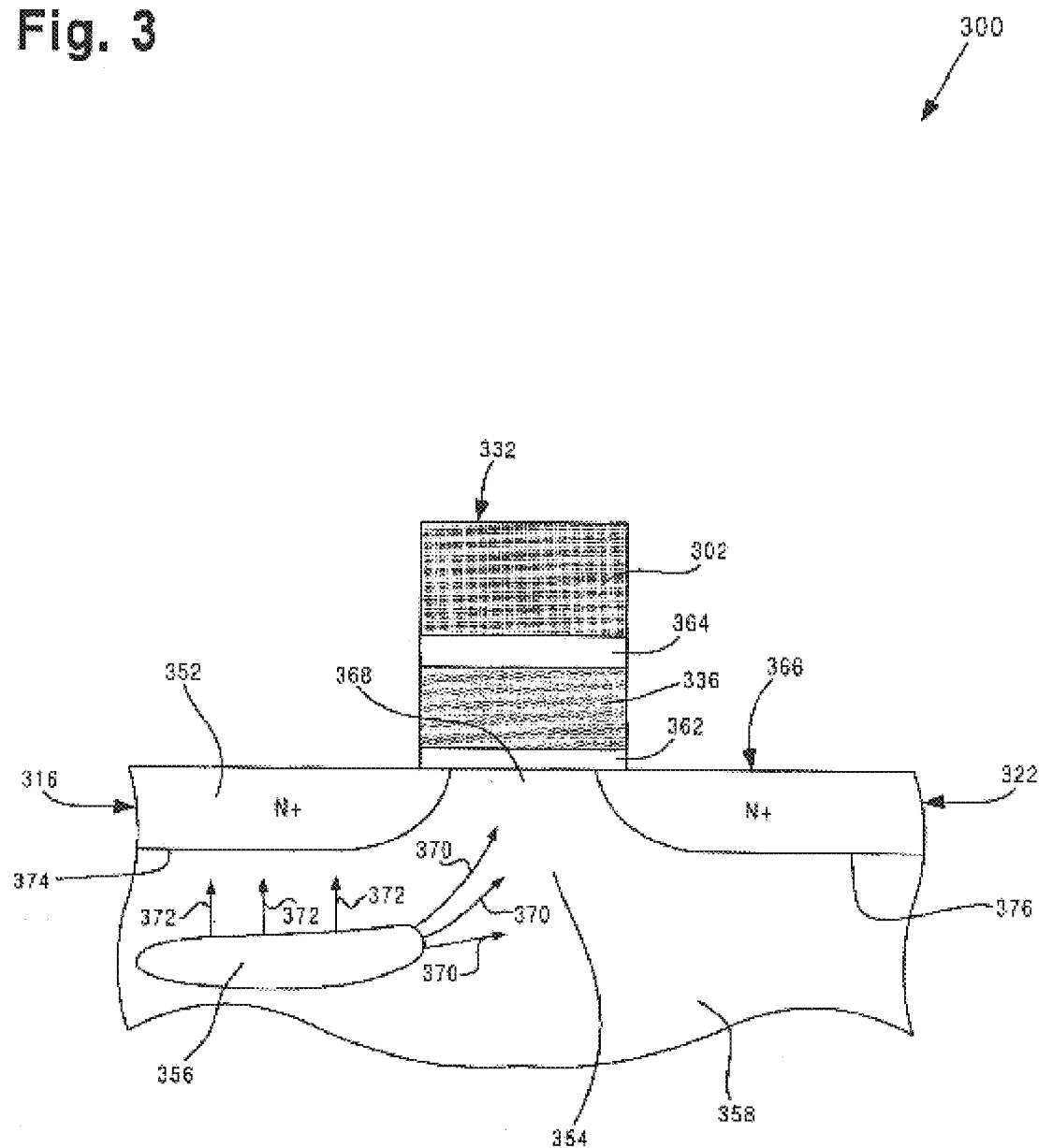
FIG. 3 illustrates a cross-sectional view along the line 3—3 in FIG. 1 of the structure of FIG. 1.

Structure 300 in FIG. 3 corresponds to a cross-sectional view of structure 100 along line 3—3 in FIG. 1. In particular, memory cell 332, word line 302, floating gate 336, source region 316, and drain region 322, in structure 300, respectively, correspond to memory cell 132, word line 102, floating gate 136, source region 116, and drain region 122, in structure 100. Also, source region 316, N+ type region 352, P well 354, and substrate 358, in structure 300, respectively, correspond to source region 216, N+ type region 252, P well 254, and substrate 258, in structure 200 in FIG. 2. It is noted that contact 138 is not shown in FIG. 3 to preserve clarity of illustration.

As shown in FIG. 3, memory cell 332 includes tunnel oxide layer 362, which is situated on top surface 366 of substrate 358 and can comprise thermally grown tunnel oxide. Also shown in FIG. 3, floating gate 336 is situated over tunnel oxide layer 362 and can comprise polycrystalline silicon. Further shown in FIG. 3, dielectric layer 364 is situated over floating gate 336 and can comprise, for example, an Oxide-Nitride-Oxide ("ONO") stack. Also shown in FIG. 3, word line 302 is situated over dielectric layer 364 and can comprise polycrystalline silicon.

Further shown in FIG. 3, N+ type region 352 is situated in source region 316 and can be formed by implanting an appropriate N type dopant in top surface 366 of substrate 358. Also shown in FIG. 3, drain region 322 is situated in substrate 358 and is an N+ type region. Further shown in FIG. 3, channel region 368 is situated between source junction 374 and drain junction 376 and also situated underneath tunnel oxide layer 362. Also shown in FIG. 3, P well 354 is situated in substrate 358 underneath N+ type region 352, channel region 368, and drain region 322. P well 354 can be formed in substrate 358 in a manner known in the art.

Further shown in FIG. 3, P type region 356 is situated underneath N+ type region 352 and is formed by utilizing P type implant 260 in FIG. 2 to implant a P type dopant, e.g. boron. After a subsequent thermal drive step, P type dopant in P type region 356 diffuses in an upward direction approaching top surface 366 of substrate 358 as indicated by arrows 372. As a result, the P type dopant forms a retrograde profile underneath N+ type region 352 in P well 354. The P type dopant also diffuses toward the center of channel region 368 as indicated by arrows 370. As a result of P type dopant diffusion as indicated by arrows 370, the P type dopant forms a graded concentration profile in a portion of P well 354 situated underneath floating gate 336 and also situated adjacent to N+ type region 352, which is situated in source region 316. Since drain region 322 is protected by a mask during performance of P type implant 260 as discussed above, retrograde and graded concentration profiles are not formed adjacent to drain region 322. Thus, by providing retrograde and graded concentration profiles adjacent to source region 316, the present invention advantageously achieves reduced short channel effects discussed above, such as punch through and DIBL. Furthermore, by not forming retrograde and graded concentration profiles adjacent to drain region 322, the present invention advantageously avoids undesirable drain junction breakdown. Thus, as a result of reducing short channel effects, the present invention advantageously achieves increased short channel performance.

Figure 4:
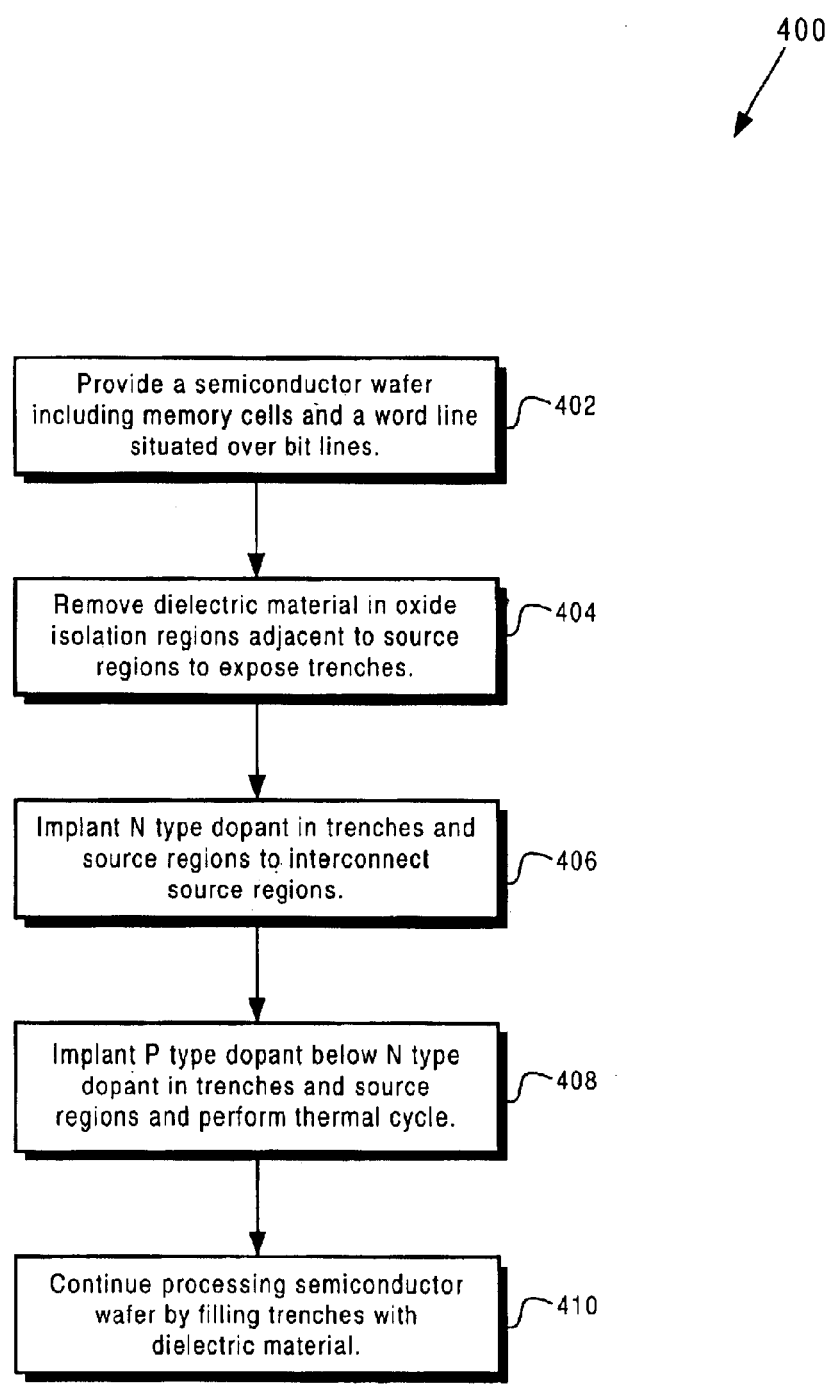
FIG. 4 is a flow chart corresponding to exemplary method steps according to one embodiment of the present invention.

FIG. 4 shows a flow chart illustrating an exemplary method according to an embodiment of the present invention. Certain details and features have been left out of flow chart 400 that are apparent to a person of ordinary skill in the art. For example, a step may consist of one or more substeps or may involve specialized equipment or materials, as known in the art.

At step 402, a semiconductor wafer is provided, which includes memory cells, such as memory cells 130, 132, and 134 in FIG. 1, and a word line, such as word line 102, situated over bit lines, such as bit lines 104, 106, and 108. At step 404, dielectric material is removed in oxide isolation regions, such as oxide isolation regions 110 and 112 in FIG. 1, to expose respective trenches, such as trenches 126 and 128. Dielectric material can be removed from oxide isolation regions 110 and 112 to expose trenches 126 and 128, respectively, by performing a self-aligned source etch, for example. At step 406, N type dopant, such as arsenic, is implanted in trenches, such as trenches 126 and 128, and source regions, such as source regions 114, 116, and 118, to electrically interconnect the source regions.

At step 408, P type dopant is implanted in trenches, such as trenches 126 and 128, and source regions, such as source regions 114, 116, and 118 to form a P type region, such as P type region 356 situated underneath an N+ type region, such as N+ type region 252 in FIG. 2. For example, boron can be implanted deep below respective top surfaces 213, 215, and 217 of source regions 214, 216, and 218, sidewalls 246 and bottom surface 244 of trench 226, and sidewalls 250 and bottom surface 248 of trench 228 at implant angle 262 with respect to respective top surfaces 213,215, and 217 of source regions 214, 216, and 218. By way of example, implant angle 262 can be between approximately 45.0 degrees and approximately 90.0 degrees. A thermal cycle is performed to diffuse P type dopant in P type region 356 to form retrograde and graded concentration profiles adjacent to source regions, such as source region 216. At step 410, processing of the semiconductor wafer continues by filling trenches, such as trenches 126 and 128 in FIG. 1, with dielectric material, such as silicon oxide.

Thus, as discussed above, by utilizing a P type dopant, such as boron, to form retrograde and graded concentration profiles adjacent to source regions of floating gate memory cells, such as floating gate flash memory cells, to reduce undesirable short channel effects, the present invention advantageously achieves increased increase short channel performance in floating gate memory cells.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, method for reducing short channel effects in memory cells and related structure have been described.

What is claimed is:

1. A method for fabricating a floating gate memory array, said method comprising steps of:

removing a dielectric material from an isolation region situated in a substrate to expose a trench, said trench being situated between a first source region and a second source region, said trench defining sidewalls in said substrate;

implanting an N type dopant in said first source region, said second source region, and said sidewalls, said N type dopant forming an N+ type region;

implanting a P type dopant in said first source region, said second source region, and said sidewalls, said P type dopant forming a P type region, said P type region being situated underneath said N+ type region;

wherein said P type dopant is not implanted in a drain region, said drain region being separated from said first source region by a word line.

2. The method of claim 1 wherein said step of implanting said P type dopant in said first source region, said second source region, and said sidewalls comprises implanting said P type dopant at an angle with respect to a top surface of said first source region, said angle being between approximately 45.0 degrees and approximately 90.0 degrees.

3. The method of claim 1 further comprising a step of performing a thermal cycle, said thermal cycle causing said P type dopant to form a retrograde profile underneath said N+ type region.

4. The method of claim 1 further comprising a step of performing a thermal cycle, said thermal cycle causing said P type dopant to form a graded concentration profile adjacent to said N+ type region.

5. The method of claim 1 wherein said P type dopant is boron.

6. The method of claim 1 wherein said step of removing said dielectric material from said isolation region comprises removing said dielectric material in a self-aligned source etch.

7. The method of claim 1 wherein said floating gate memory array is a floating gate flash memory array.

8. The method of claim 1 wherein said step of implanting said P type dopant in said first source region, said second source region, and said sidewalls comprises implanting said P type dopant at a dosage of between approximately $1 \times 10^{14}$ atoms per $cm^2$ and approximately $1 \times 10^{15}$ atoms per $cm^2$.

9. A method for fabricating a floating gate memory array comprising steps of removing a dielectric material from an isolation region situated in a substrate to expose a trench, said trench being situated between a first source region and a second source region, said trench defining sidewalls in said substrate, implanting an N type dopant in said first source region, said second source region, and said sidewalls, said N type dopant forming an N+ type region, said method being characterized by:

implanting a P type dopant in said first source region, said second source region, and said sidewalls, said P type dopant forming a P type region, said P type region being situated underneath said N+ type region, wherein said P type dopant is not implanted in a drain region, said drain region being separated from said first source region by a word line.

10. The method of claim 9 wherein said step of implanting said P type dopant in said first source region, said second source region, and said sidewalls comprises implanting said P type dopant at an angle with respect to a top surface of said first source region, said angle being between approximately 45.0 degrees and approximately 90.0 degrees.

11. The method of claim 9 further comprising a step of performing a thermal cycle, said thermal cycle causing said P type dopant to form a retrograde profile underneath said N+ type region.

12. The method of claim 9 further comprising a step of performing a thermal cycle, said thermal cycle causing said P type dopant to form a graded concentration profile adjacent to said N+ type region.

13. The method of claim 9 wherein said P type dopant is boron.

14. The method of claim 9 wherein said floating gate memory array is a floating gate flash memory array.

15. The method of claim 9 wherein said step of implanting said P type dopant in said first source region, said second source region, and said sidewalls comprising implanting said P type dopant at a dosage of between approximately $1 \times 10^{14}$ atoms per $cm^2$ and approximately $1 \times 10^{15}$ atoms per $cm^2$.

* * * * *